(12) United States Patent
Yeh et al.

(10) Patent No.: US 8,343,617 B2
(45) Date of Patent: Jan. 1, 2013

(54) CERAMIC SUBSTRATE

(75) Inventors: Yu-Hsin Yeh, Yonghe (TW); Tzer-Shen Lin, Hsinchu (TW); Ren-Der Jean, Hsinchu (TW)

(73) Assignee: Industrial Technology Research Institute, Hsinchu County (TW)

( * ) Notice: Subject to any disclaimer, the term of this patent is extended or adjusted under 35 U.S.C. 154(b) by 401 days.

(21) Appl. No.: 12/691,728

(22) Filed: Jan. 21, 2010

(65) Prior Publication Data

US 2010/0260970 A1 Oct. 14, 2010

(30) Foreign Application Priority Data

Apr. 9, 2009 (TW) .............................. 98111795 A
Dec. 3, 2009 (TW) .............................. 98141302 A

(51) Int. Cl.
*B32B 3/00* (2006.01)
*B32B 7/00* (2006.01)
*B32B 17/00* (2006.01)
*B32B 18/00* (2006.01)

(52) U.S. Cl. ........ 428/210; 428/212; 428/428; 428/699; 428/702

(58) Field of Classification Search .................. 428/210, 428/212, 141, 428, 432, 699, 702; 501/65, 501/67, 68, 69, 79
See application file for complete search history.

(56) References Cited

U.S. PATENT DOCUMENTS

| | | | | |
|---|---|---|---|---|
| 3,840,394 A | * | 10/1974 | Eppler | ........................... 428/446 |
| 4,634,634 A | | 1/1987 | Kondo et al. | |
| 4,746,578 A | * | 5/1988 | Kondo et al. | ................. 428/432 |
| 4,839,313 A | * | 6/1989 | Kondo et al. | ................... 501/14 |
| 5,108,843 A | * | 4/1992 | Ohtaka et al. | ................. 428/446 |
| 5,922,444 A | * | 7/1999 | Tsuzuki et al. | ............... 428/220 |
| 6,402,156 B1 | * | 6/2002 | Schutz et al. | ................. 277/316 |
| 7,332,231 B2 | * | 2/2008 | Ichiyanagi et al. | .......... 428/631 |
| 2007/0297108 A1 | | 12/2007 | Collins et al. | |

FOREIGN PATENT DOCUMENTS

| | | |
|---|---|---|
| CA | 820980 A | 8/1969 |
| CN | 101416570 A | 4/2009 |
| JP | 56-054253 A | 5/1981 |
| JP | 59-088337 A | 5/1984 |
| JP | 60-131881 A | 7/1985 |
| JP | 60-155550 A | 8/1985 |
| JP | 62-096344 A | 5/1987 |
| JP | 01-188443 A | 7/1989 |
| JP | 03-075237 A | 3/1991 |
| JP | 03-164444 A | 7/1991 |
| JP | 03-183639 A | 8/1991 |

OTHER PUBLICATIONS

First examination opinion notification issued by the China Intellectual Property Office on Mar. 26, 2012, for the above-referenced application's counterpart application in China (Application No. 201010110451.2).

* cited by examiner

*Primary Examiner* — Maria Veronica Ewald
*Assistant Examiner* — Joanna Pleszczynska
(74) *Attorney, Agent, or Firm* — Pai Patent & Trademark Law Firm; Chao-Chang David Pai

(57) ABSTRACT

A Ceramic substrate is provided. The ceramic substrate includes a ceramic main body and a planar buffer layer on the ceramic main body. Further, the coefficient of thermal expansion of the ceramic main body $CTE_m$ and the coefficient of thermal expansion of the planar buffer layer $CTE_p$ satisfy the following mathematical relationship: $|CTE_m - CTE_p| \leq 3 \times 10^{-6}/°C$.

10 Claims, No Drawings

CERAMIC SUBSTRATE

CROSS REFERENCE TO RELATED APPLICATIONS

This application is based upon and claims the benefit of priority from the prior Taiwan Patent Application No. 98111795, filed on Apr. 9, 2009, and the prior Taiwan Patent Application No. 98141302, filed on Dec. 3, 2009, the entire contents of which are incorporated herein by reference.

BACKGROUND OF THE INVENTION

1. Field of the Invention

The invention relates to a ceramic substrate, and more particularly to a ceramic main body with a planar buffer layer.

2. Description of the Related Art

Ceramic materials are widely used in communication devices, computers, medical devices, and military devices, due to their high mechanical strength, thermal conductivity, thermostability, and superior dielectric characteristics. Ceramic substrates are increasingly being applied as the carriers of micro electro mechanical systems, solar cells, and light emitting diodes for applications in semiconductor, storage device, display, and optoelectronic product.

One major disadvantage of conventional ceramic substrates is the extremely rough surfaces, there are a plurality of various sized pores exist on the surfaces, particularly, when forming semiconductor elements or depositing specific layers, such as Si, Ge, SiGe, CIGS (Cu—In—Ga—Se system with different molar radio), GaN, GaAs, ZnO, ITO, GZO (Ga doped ZnO) or AZO (Al doped ZnO) on a conventional ceramic substrate, the high roughness average (Ra) surface thereof decreases fabrication yields. The Ra has be defined the mathematics formula as $$Ra = \frac{(h1 + h2 + h3 + \ldots hn) \cdot \Delta x}{L} = \frac{\sum f(x) dx}{L},$$

where the L is the measurement length and segment to n section with the same length x, h1 is the height at position 1, h2 is the height at position 2 and deduced by analogy to hn.

Several methods have been employed to solve the roughness average problem, which include mechanical polishing process, chemical mechanical planarization (CMP) process, chemical etching process, spin-on glass process, and BPSG (borophosphosilicate glass) reflow treatment process.

In practice, the roughness average of a rigid substrate can be reduced by mechanical polishing. Of the available industry methods, chemical mechanical planarization (CMP) is complex, costly and time consuming. Due to the characteristics of the ceramic substrate, pores are produced during mechanical polishing. Further, pollutants may be introduced into the ceramic substrate during the CMP process. As for the BPSG reflow treatment process, it is a silane-based treatment process with $PH_3$ and $B_2H_6$ dopant sources, however, $PH_3$ and $B_2H_6$ are toxic gases. Additionally, the BPSG reflow treatment process is applied exclusively for isolation the ceramic substrate before a metallization process. Meanwhile, the spin-on glass process provides only partial planarization of the ceramic substrate surface and tends to cause outgassing. Furthermore, the adhesion of spin-on glass layers onto ceramic substrates is poor.

Accordingly, the disadvantages of conventional methods for improving roughness average of ceramic substrates are high cost and complex process steps. Further, conventional ceramic substrates cannot be used in high temperature processes due to the coefficient of thermal expansion mismatch with device or further deposited film thereof, which resulting in limited applicability.

In order to solve the aforementioned problems, vitreous materials are often used as a coating for some conventional ceramic substrates to improve surface characteristics thereof, and further enhance applicability. For example, conventional ceramic substrates can be fabricated to have higher chemical resistance, low liquid or gas permeation resistance, smoother surfaces, higher mechanical strength, higher friction resistance, and higher abrasion resistance, etc, thus enhancing its applicability and value of use. Since high temperature processing is required for good electronic devices performance, a matched or relatively lower coefficient of thermal expansions for conventional ceramic substrates is desired.

For example, in optoelectronic devices employing a conventional ceramic substrate deteriorate the performance. Specifically, the different coefficients of thermal expansion between the optoelectronic material (such as glass or quartz) and the conventional ceramic substrate during high temperature process will deformation or distortion due to the thermal stress therein. Further, in light emitting diodes or solar cells employing conventional ceramic materials as carrier substrates, the film or device on the ceramic substrates may warp or swell due to the large differences in the coefficients of thermal expansion of both films and substrates. Further, the high roughness average may increase the failure rates of the devices.

Therefore, it is necessary to develop a ceramic substrate with low roughness average, suitable coefficient of thermal expansion and higher heat resistant ability to solve the previously described problems.

BRIEF SUMMARY OF THE INVENTION

An exemplary embodiment of a ceramic substrate is provided and includes: a ceramic main body; and a planar buffer layer on the ceramic main body, wherein the planar buffer material has higher softening point and the working point cannot be too high to over the melting point of ceramic main body. So the coefficient of thermal expansion relationship between the ceramic main body $CTE_m$ and the planar buffer layer $CTE_p$ is represented by the following equation $|CTE_m - CTE_p| \leq 3 \times 10^{-6}/°C$. Particularly, the planar buffer layer consists of: 30-95 parts by weight of $SiO_2$; 2-40 parts by weight of $Al_2O_3$; 3-35 parts by weight of $B_2O_3$, $P_2O_5$, alkaline earth metal oxide, or combinations thereof; and 0-46 parts by weight of $ZrO_2$, ZnO, $TiO_2$, $Y_2O_3$, $La_2O_3$, $WO_x$, $SnO_2$, $GeO_2$, or combinations thereof, wherein x is 2 or 3, that the $SiO_2$ is the major element in the composition. The softening point is a temperature at which planar buffer material deforms noticeably by external force, which the viscosity isotherm at $\log_{10}$ (viscosity) between 9 to 11 poise that depend on the loading, in our study the loading is 5 g. The working point is a temperature at which planar buffer material can be processed to combine with ceramic main body, which the viscosity isotherm at $\log_{10}$(viscosity) equal to 4 poise or less.

The ceramic substrate provided by embodiments of the invention can be applied in solar cells, light emitting diodes, integrated circuit packages, micro electro mechanical systems, electronic devices, or thin film transistors.

A detailed description is given in the following embodiments with reference to the accompanying drawings.

DETAILED DESCRIPTION OF THE INVENTION

The following description is of the best-contemplated mode of carrying out the invention. This description is made for the purpose of illustrating the general principles of the invention and should not be taken as a limiting sense. The scope of the invention is best determined by reference to the appended claims.

Embodiments of the invention provide ceramic substrates with a coefficient of thermal expansion similar to the elements formed thereon, thereby preventing the distortion. The ceramic substrate of the invention includes a ceramic main body and a planar buffer layer, wherein the planar buffer layer has an adjustable coefficient of thermal expansion which matches the ceramic main body. The planar buffer layer serves as a buffer between the ceramic main body and the functional layers subsequently forming on the ceramic substrate. Further, the planar buffer layer employed on the ceramic substrate of the invention can improve the roughness average of ceramic substrate and serves as a barrier layer for preventing impurities diffusing into the subsequently formed elements therein.

More specifically in the invention, the relationship between the coefficient of thermal expansion of the ceramic main body $CTE_m$ and the coefficient of thermal expansion of the planar buffer layer $CTE_p$ is represented by the following equation $|CTE_m - CTE_p| \leq 3 \times 10^{-6}/°C$. When the ceramic main body has a larger coefficient of thermal expansion, a warpage may occur when combined with the planar buffer layer with smaller coefficient of thermal expansion. Since the coefficient of thermal expansion of the planar buffer layer $CTE_p$ of the invention is less than $7 \times 10^{-6}/°C$., the planar buffer layers of the invention are suitable to be formed on the ceramic main body with a coefficient of thermal expansion $CTE_m$ less than $10 \times 10^{-6}/°C$.

According to the experimental results of the invention, when the relationship between the coefficient of thermal expansion of the ceramic main body CTEm and the coefficient of thermal expansion of the planar buffer layer CTEp is represented by the following equation $|CTEm - CTEp| > 3 \times 10^{-6}/°C$., the ceramic substrate exhibits a warpage larger than 0.5%, whatever the components and the thickness of the planar buffer layer are. The ceramic substrate provided by embodiments of the invention can be applied in solar cells, light emitting diodes, integrated circuit packages, micro electro mechanical systems, electronic devices, or thin film transistors. The warpage (W %) is the quantification of shape deformed and has be defined as the mathematics formula:

$$W\% = \frac{T1 - T0}{L} \times 100\%,$$

where L is the length of the substrate, T1 is the thickness of the sintered substrate and T0 is the thickness of origin substrate.

Table 1 shows the compositions and coefficient of thermal expansion of conventional planar buffer layers. As shown in Table 1, the conventional planar buffer layers have a coefficient of thermal expansion between $4.9-9.0 \times 10^{-6}/°C$. The planar buffer layers with alkaline metal oxide, lead oxide, or ferric oxide, which reduces the softening point and working point at the same time that can easily combine with ceramic main body, but these material will easily diffused into the film or device, and will deformation or damage simultaneously.

TABLE 1

| Patent No. | Components | CTE ($1 \times 10^{-6}/°C.$) |
|---|---|---|
| CA820980 | 38-43% $SiO_2$, 4-10% $Al_2O_3$, 0-10% CaO, 5-18% BaO, 0-10% $B_2O_3$, 13-22% PbO, 5-15% $Bi_2O_3$, 0.5-2% $TiO_2$, 0.5-2% $K_2O$, 0.25-1% $As_2O_3$ | >5.8 |
| JP5654253 | 55-70% $SiO_2$, 1-5% $Al_2O_3$, 5-15% CaO, 1-15% BaO, 3-20% $B_2O_3$, 0.5-20 SrO, <2% MgO, <2% ZnO, <10% PbO | >5.5 |
| JP5988337 | 58-63% $SiO_2$, 6-12% $Al_2O_3$, 3-8% $B_2O_3$, 20-28% (CaO + SrO + BaO), <6% (MgO, ZnO, TiO2) | 7.0-9.0 |
| JP60131881 | 55-75% $SiO_2$, 1-15% $Al_2O_3$, 0.5-7% $B_2O_3$, 1-13% BaO, 3-20% CaO, 0.5-25% SrO, 0.1-5% $Y_2O_3$ | 5.1-6.7 |
| JP60155550 | 58-75% $SiO_2$, 2-15% $Al_2O_3$, <7% $B_2O_3$, 1-13% BaO, 2-20 CaO, <2% MgO, 0.5-5% $La_2O_3$, <25% SrO, <5% $Y_2O_3$ | 5.2-6.7 |
| JP6296344 | 45-60% $SiO_2$, 7-17% $Al_2O_3$, 1-15% BaO, 10-25 CaO, <2% MgO, 0-15% SrO, 0.5-5% $P_2O_5$ | 5.9-7.1 |
| U.S. Pat. No. 4,634,634 | 56-71 mol % $SiO_2$, 6-16 mol % $Al_2O_3$, 15.5-28 mol % BaO, <10 mol % others (<10% SrO, <8 mol % $B_2O_3$, <10 mol % CaO, <2 mol % MgO) | 4.9-8.7 |
| JP1188443 | 45-60% $SiO_2$, 1-5% $Al_2O_3$, 1-7% $B_2O_3$, 23-35% BaO, 1-20 CaO, 1-5% ZnO | 6.3-7.3 |
| JP375237 | 45-60% $SiO_2$, 5-14% $Al_2O_3$, 3-25% BaO, 5-15 CaO, 0.5-5% MgO, 5-30% SrO, 0-5% $La_2O_3$ | 6.5-6.8 |
| JP3164444 | 45-60% $SiO_2$, 5-15% $Al_2O_3$, 0.5-5% $B_2O_3$, 5-25% BaO, 2-15 CaO, <1% MgO, 2-30% SrO, 0.5-10% $ZrO_2$, <3% ZnO | 5.5-6.3 |
| JP3183639 | 45-60% $SiO_2$, 5-15% $Al_2O_3$, 1-20% BaO, 5-25 CaO, 0-5% MgO, 1-20% SrO, 2-6% $ZrO_2$ | 5.6-7.0 |

Accordingly, the prior planar buffer layer formed on a ceramic main body with lower CTE may have cracks and be deformed due to the differences in the coefficient of thermal expansion, but the planar buffer layer in this invention, the problem will be eliminated.

The ceramic substrate according to the embodiments of the invention includes a ceramic main body and a planar buffer layer on the ceramic main body. A planar buffer layer can consist of 30-95 parts by weight of $SiO_2$, 2-40 parts by weight of $Al_2O_3$, 3-35 parts by weight of $B_2O_3$, $P_2O_5$, alkaline earth metal oxide, or combinations thereof, and 0-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3. By using $ZrO_2$, $ZnO$, $TiO_2$, $Y_2O_3$, $La_2O_3$, $WO_x$, $SnO_2$, $GeO_2$, or combinations to adjust the softening point greater than 700° C. and coefficient of thermal expansion is less than $7\times10^{-6}/°$ C. in the lower $SiO_2$ contain, the planar buffer layer can consist of 30-75 parts by weight of $SiO_2$, 5-40 parts by weight of $Al_2O_3$, 0-30 parts by weight of $B_2O_3$, $P_2O_5$, alkaline earth metal oxide, or combinations thereof, and 25-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3. Furthermore, the planar buffer layer has higher $SiO_2$ contain can reach the goal with or without $ZrO_2$, $ZnO$, $TiO_2$, $Y_2O_3$, $La_2O_3$, $WO_x$, $SnO_2$, $GeO_2$, or combinations, so the composition can consist of 76-95 parts by weight of $SiO_2$, 1-25 parts by weight of $Al_2O_3$, 4-35 parts by weight of $B_2O_3$, $P_2O_5$, alkaline earth metal oxide, or combinations thereof, and 0-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3. Particularly, the relationship between the coefficient of thermal expansion of the ceramic main body $CTE_m$ and the coefficient of thermal expansion of the planar buffer layer $CTE_p$ can be represented by the following equation: $|CTE_m - CTE_p| \leq 3\times10^{-6}/°$ C. Equation (I)

The planar buffer layer has a thickness of less than 200 μm, preferably not more than 150 μm (such as 5-150 μm). It should be noted that the planar buffer layer of the invention does not contain alkaline metal oxide (such: $Na_2O$, or $K_2O$) or ferric oxide, thus avoid the diffusion of these elements into the film or device. Furthermore, the planar buffer layer of the invention does not contain lead oxide, which is environmentally safer. In order to increase the softening point and decrease the working point of the planar buffer layer, includes 3-35 parts by weight of $B_2O_3$, $P_2O_5$, alkaline earth metal oxide, or combinations thereof.

The planar buffer layer is an amorphous material, $SiO_2$ is the network forming reagent that the higher weight ratio will increase the softening point and decrease the coefficient of thermal expansion. $Al_2O_3$ can stabilize the amorphous network that the higher weight ratio will increase the softening point, and increase the coefficient of thermal expansion. $B_2O_3$ and $P_2O_5$ have the similar capability to $Al_2O_3$, to increase the coefficient of thermal expansion but lower the softening point. The alkaline earth metal oxide can decrease the softening point and increase the coefficient of thermal expansion when increasing the weight ratio. The coefficient of thermal expansion of the planar buffer layer is less than $7\times10^{-6}/°$ C. and the softening point is greater than 700° C., the composition of the planar buffer layer has higher weight ratio of $Al_2O_3$ is differ from previous study can consist of 46-60 parts by weight of $SiO_2$, 18-26 parts by weight of $Al_2O_3$, 22-35 parts by weight of $B_2O_3$, $P_2O_5$, alkaline earth metal oxide, or combinations thereof, and 0-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3, further, the weight ratio of $Al_2O_3$ is higher than 27 parts by weight, the weight ratio of $B_2O_3$, $P_2O_5$, alkaline earth metal oxide, or combinations thereof would be reduced to 13-25 parts by weight and 0-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3.

Following the same design rule, the composition of the planar buffer layer can consist of 61-75 parts by weight of $SiO_2$, 16-25 parts by weight of $Al_2O_3$, 9-30 parts by weight of $B_2O_3$, $P_2O_5$, alkaline earth metal oxide, or combinations thereof, and 0-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3. Since the weight ratio of $SiO_2$ is increased (61-75 parts by weight) and the weight ratio of $Al_2O_3$ is reduced (16-25 parts by weight), the weight ratio of the $B_2O_3$, $P_2O_5$, alkaline earth metal oxide, or combinations thereof must be increased (9-30 parts by weight) in order to decrease the working point.

In embodiments of the invention, the weight ratio between $B_2O_3$ and the alkaline earth metal oxide can be more than 1.56, in order to increase the softening point of the planar buffer layer. In the other hand, when the weight ratio between $B_2O_3$ and the alkaline earth metal oxide is less than 1.56, the planar buffer layer can further include $ZrO_2$, $ZnO$, $TiO_2$, $Y_2O_3$, $La_2O_3$, $WO_x$, $SnO_2$, $GeO_2$, or combinations thereof to increase the softening point thereof. Further, the weight ratio between $B_2O_3$ and $SiO_2$ can be more than 0.182 to increase the softening point of the planar buffer layer. In the other hand, when the weight ratio between $B_2O_3$ and $SiO_2$ is less than 0.182, the planar buffer layer can further include $ZrO_2$, $ZnO$, $TiO_2$, $Y_2O_3$, $La_2O_3$, $WO_x$, $SnO_2$, $GeO_2$, or combinations thereof, in order to increase the softening point. The composition of the planar buffer layer can consist of 45-75 parts by weight of $SiO_2$, 5-40 parts by weight of $Al_2O_3$, 5-30 parts by weight of $B_2O_3$, $P_2O_5$, alkaline earth metal oxide, or combinations thereof, and 16-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3.

The thermal resistant ability of the ceramic substrate can be improved by increasing the softening point of planar buffer layer, resulting in that the ceramic substrate can be used during the high temperature process.

In embodiments of the invention, the coefficient of thermal expansion of the ceramic main body CTEm is less than $10\times10^{-6}/°$ C., and the coefficient of thermal expansion of the planar buffer layer CTEp is less than $7\times10^{-6}/°$ C. According to the embodiments, the coefficient of thermal expansion of the planar buffer layer CTEp can be betweenness $2–4.8\times10^{-6}/°$ C., and the roughness average of the ceramic substrate is less than 150 nm. (The planar buffer layers 1, 3, 4, 7, 10-14, 16-20, 22 in table 2)

The ceramic main body can includes graphite, silicon nitride, silicon carbide, silicon oxide, alumina, mullite, granite, marble, or combinations thereof. Further, the relationship between the weight W1 of the silicon oxide and alumina and the weight W2 of silicon oxide, alumina, mullite, granite, and marble can be represented by the following equation: $0.5 \leq W1/W2 \leq 2$ Equation (II)

The ceramic main body of the invention has a softening point greater than 800° C., and the planar buffer layer has a softening point greater than 700° C.

In an embodiment of the invention, the planar buffer layer can consist of 30-95 parts by weight of $SiO_2$, 2-40 parts by weight of $Al_2O_3$, 3-35 parts by weight of $B_2O_3$, $P_2O_5$, alkaline earth metal oxide, or combinations thereof, and 0-46 parts by weight of $ZrO_2$, $ZnO$, $TiO_2$, $Y_2O_3$, $La_2O_3$, $WO_x$, $SnO_2$, $GeO_2$, or combinations thereof, wherein x is 2 or 3.

In another embodiment of the invention, the planar buffer layer can consist of 30-75 parts by weight of $SiO_2$, 5-40 parts by weight of $Al_2O_3$, 0-35 parts by weight of $B_2O_3$, $P_2O_5$, alkaline earth metal oxide, or combinations thereof and 25-46 parts by weight of $ZrO_2$, ZnO, $TiO_2$, $Y_2O_3$, $La_2O_3$, $WO_x$, $SnO_2$, $GeO_2$, or combinations thereof, wherein x is 2 or 3.

In another embodiment (high $SiO_2$ contain) of the invention, the planar buffer layer can consist of 76-95 parts by weight of $SiO_2$, 1-25 parts by weight of $Al_2O_3$, 4-35 parts by weight of $B_2O_3$, $P_2O_5$, alkaline earth metal oxide, or combinations thereof and 0-46 parts by weight of $ZrO_2$, ZnO, $TiO_2$, $Y_2O_3$, $La_2O_3$, $WO_x$, $SnO_2$, $GeO_2$, or combinations thereof, wherein x is 2 or 3.

The following examples are intended to illustrate the invention more fully without limiting the scope of the invention, since numerous modifications and variations will be apparent to those skilled in this art.

Preparation of the Planar Buffer Layer

Example 1

The components of the planar buffer layers 1-22 are shown in Table 2.

TABLE 2

| | Components of the planar buffer layer | | | | | | | | | | | | | | | |
|---|---|---|---|---|---|---|---|---|---|---|---|---|---|---|---|---|
| No. | $SiO_2$ (wt %) | $Al_2O_3$ (wt %) | $B_2O_3$ (wt %) | $P_2O_5$ (wt %) | CaO (wt %) | MgO (wt %) | BaO (wt %) | SrO (wt %) | ZnO (wt %) | $ZrO_2$ (wt %) | $TiO_2$ (wt %) | $GeO_2$ (wt %) | $Y_2O_3$ (wt %) | $La_2O_3$ (wt %) | WOx (wt %) | $SnO_2$ (wt %) |
| 1 | 34 | 8 | 6 | 0 | 2 | 2 | 2 | 0 | 0 | 0 | 0 | 0 | 0 | 44 | 0 | 2 |
| 2 | 36 | 18 | 0 | 0 | 0 | 0 | 0 | 0 | 0 | 0 | 0 | 0 | 4 | 42 | 0 | 0 |
| 3 | 40 | 10 | 7 | 0 | 0 | 0 | 0 | 0 | 0 | 1 | 0 | 0 | 1 | 41 | 0 | 0 |
| 4 | 41 | 12 | 8 | 0 | 5 | 4 | 0 | 2 | 0 | 0 | 0 | 28 | 0 | 0 | 0 | 0 |
| 5 | 45 | 11 | 8 | 0 | 0 | 5 | 0 | 0 | 0 | 0 | 0 | 0 | 0 | 31 | 0 | 0 |
| 6 | 46 | 11 | 8 | 0 | 0 | 5 | 0 | 0 | 0 | 0 | 0 | 0 | 30 | 0 | 0 | 0 |
| 7 | 47 | 37 | 2 | 2 | 6 | 6 | 0 | 0 | 0 | 0 | 0 | 0 | 0 | 0 | 0 | 0 |
| 8 | 47 | 36 | 5 | 0 | 12 | 0 | 0 | 0 | 0 | 0 | 0 | 0 | 0 | 0 | 0 | 0 |
| 9 | 50 | 12 | 8 | 1 | 0 | 5 | 0 | 0 | 0 | 0 | 0 | 0 | 24 | 0 | 0 | 0 |
| 10 | 51 | 24 | 0 | 0 | 10 | 0 | 0 | 0 | 0 | 0 | 0 | 15 | 0 | 0 | 0 | 0 |
| 11 | 53 | 13 | 9 | 0 | 0 | 8 | 0 | 0 | 0 | 0 | 0 | 0 | 0 | 18 | 0 | 0 |
| 12 | 53 | 12 | 8 | 0 | 11 | 0 | 0 | 0 | 0 | 0 | 0 | 15 | 0 | 0 | 0 | 0 |
| 13 | 53 | 18 | 4 | 0 | 15 | 4 | 5 | 0 | 1 | 0 | 0 | 0 | 0 | 0 | 0 | 0 |
| 14 | 54 | 18 | 5 | 3 | 0 | 5 | 15 | 0 | 0 | 0 | 0 | 0 | 0 | 0 | 0 | 0 |
| 15 | 54 | 28 | 5 | 0 | 0 | 13 | 0 | 0 | 0 | 0 | 0 | 0 | 0 | 0 | 0 | 0 |
| 16 | 56 | 29 | 12 | 0 | 0 | 1 | 0 | 0 | 2 | 0 | 0 | 0 | 0 | 0 | 0 | 0 |
| 17 | 62 | 16 | 4 | 0 | 10 | 2 | 0 | 6 | 0 | 0 | 0 | 0 | 0 | 0 | 0 | 0 |
| 18 | 64 | 17 | 3 | 0 | 8 | 7 | 0 | 0 | 0 | 0 | 0 | 0 | 0 | 0 | 0 | 1 |
| 19 | 73 | 17 | 6 | 0 | 0 | 4 | 0 | 0 | 0 | 0 | 0 | 0 | 0 | 0 | 0 | 0 |
| 20 | 77 | 11 | 7 | 3 | 1 | 0 | 1 | 0 | 0 | 0 | 0 | 0 | 0 | 0 | 0 | 0 |
| 21 | 79 | 4 | 3 | 1 | 0 | 0 | 12 | 1 | 0 | 0 | 0 | 0 | 0 | 0 | 0 | 0 |
| 22 | 84 | 1 | 11 | 4 | 0 | 0 | 0 | 0 | 0 | 0 | 0 | 0 | 0 | 0 | 0 | 0 |

Measurement of Softening Point and CTE

Example 2

The softening point and the CTEs (between 20° C.-300° C.) of the planar buffer layers 1-22 were respectively measured, and the results are shown in Table 3.

TABLE 3

| No. | Softening point (° C.) | CTE ($10^{-6}$/° C.) |
|---|---|---|
| 1 | 897 | 2.9 |
| 2 | 889 | 5.2 |
| 3 | 925 | 3.1 |
| 4 | 827 | 4.4 |
| 5 | 866 | 5.8 |
| 6 | 875 | 5.4 |
| 7 | 906 | 4.3 |
| 8 | 892 | 5.1 |

TABLE 3-continued

| No. | Softening point (° C.) | CTE ($10^{-6}$/° C.) |
|---|---|---|
| 9 | 861 | 1.8 |
| 10 | 894 | 3.7 |
| 11 | 822 | 4.3 |
| 12 | 840 | 4.2 |
| 13 | 725 | 3.6 |
| 14 | 718 | 4.0 |
| 15 | 876 | 5.2 |
| 16 | 861 | 3.7 |
| 17 | 745 | 2.6 |
| 18 | 756 | 2.8 |
| 19 | 942 | 3.4 |
| 20 | 985 | 3.9 |
| 21 | 852 | 6.6 |
| 22 | 819 | 2.6 |

As shown in Table 3, the planar buffer layers 1-22 had softening point of greater than 700° C. Further, due to the specific components of the invention, the coefficients of thermal expansion can be modified to match that of the ceramic main body.

Measurement of Roughness Average of the Ceramic Substrate

Example 3

The components, roughness average, CTE, and warpage degree of the selected ceramic main bodies A and B are shown in Table 4.

TABLE 4

| No. | Components | Ra (nm) | CTE ($10^{-6}$/° C.) | Warpage (%) |
|---|---|---|---|---|
| A | $Al_2O_3$ | 288.3 | 8 | 0.15 |
| B | mullite | 447.6 | 4 | 0.21 |

The planar buffer material 1, 5, 7, 9, 13, 16, 18, 21 and 22 disclosed in Table 1 were respectively formed on the ceramic main body A and B, obtaining ceramic substrates 1-10. Next, the surface roughness average, differences of CTE between the ceramic main body and the planar buffer layer, and the warpage of the ceramic substrate were measured respectively, and the results are shown in Table 5.

TABLE 5

|  | Ra (nm) | Difference of CTE ($10^{-6}$/° C.) | Warpage (%) |
|---|---|---|---|
| ceramic substrate 1 (ceramic main body B & planar buffer layer 1) | 13.6 | 1.1 | 0.28 |
| ceramic substrate 2 (ceramic main body A & planar buffer layer 5) | 19.4 | 2.2 | 0.21 |
| ceramic substrate 3 (ceramic main body B & planar buffer layer 7) | 54.6 | 0.3 | 0.15 |
| ceramic substrate 4 (ceramic main body B & planar buffer layer 9) | 34.9 | 2.2 | 0.26 |
| ceramic substrate 5 (ceramic main body B & planar buffer layer 13) | 9.6 | 0.4 | 0.08 |
| ceramic substrate 6 (ceramic main body B & planar buffer layer 16) | 22.4 | 0.3 | 0.12 |
| ceramic substrate 7 (ceramic main body B & planar buffer layer 18) | 11.4 | 1.2 | 0.09 |
| ceramic substrate 8 (ceramic main body B & planar buffer layer 21) | 14.9 | 2.6 | 0.32 |
| ceramic substrate 9 (ceramic main body A & planar buffer layer 21) | 19.7 | 1.4 | 0.20 |
| ceramic substrate 10 (ceramic main body B & planar buffer layer 22) | 94.2 | 1.4 | 0.18 |

As shown in Tables 4 and 5, the roughness average of the ceramic substrate with the planar buffer layer was improved in comparison with the original ceramic main body. Further, the planar buffer layers of the invention had a roughness average less than 100 nm.

In the embodiments of the invention, the ceramic substrates withstood a processing temperature of more than 600° C., and warpage thereof were less than 0.5%. Further, the working point was higher than 800° C., and the softening point of the planar buffer layer was greater than 700° C.

While the invention has been described as above as examples and in terms of preferred embodiment, it is to be understood that the invention is not limited thereto. To the contrary, it is intended to cover various modifications and similar arrangements (as would be apparent to those skilled in the art). Therefore, the scope of the appended claims should be granted as the broadest interpretation so as to encompass all such modifications and similar arrangements.

What is claimed is:

1. A ceramic substrate, comprising:
a ceramic main body; and
a planar buffer layer on the ceramic main body, wherein the relationship between the coefficient of thermal expansion of the ceramic main body CTEm and the coefficient of thermal expansion of the planar buffer layer CTEp is represented by the following equation: $|CTEm-CTEp| \leqq 3 \times 10^{-6}$/° C., wherein a softening point of the ceramic main body is more than 800° C. and a softening point of the planar buffer layer is more than 700° C., wherein the planar buffer layer consists of:
30-75 parts by weight of $SiO_2$;
5-40 parts by weight of $Al_2O_3$;
0-35 parts by weight of $B_2O_3$, $P_2O_5$ alkaline earth metal oxide, or combinations thereof; and
25-46 parts by weight of $ZrO_2$, $Y_2O_3$, $WO_x$, $SnO_2$, $GeO_2$, or combinations thereof, wherein x is 2 or 3.

2. The ceramic substrate as claimed in claim 1, wherein the coefficient of thermal expansion of the ceramic main body CTEm is less than $10 \times 10^{-6}$/° C.

3. The ceramic substrate as claimed in claim 1, wherein the coefficient of thermal expansion of the planar buffer layer CTEp is less than $7 \times 10^{-6}$/° C.

4. The ceramic substrate as claimed in claim 1, wherein the roughness average of the ceramic substrate is less than 150 nm.

5. The ceramic substrate as claimed in claim 1, wherein the planar buffer layer has a thickness of less than 200 μm.

6. The ceramic substrate as claimed in claim 1, wherein the ceramic main body comprises graphite, silicon nitride, silicon carbide, silicon oxide, alumina, mullite, granite, marble, or combinations thereof.

7. The ceramic substrate as claimed in claim 1, wherein the roughness average of the planar buffer layer is less than 100 nm.

8. The ceramic substrate as claimed in claim 1, wherein the thickness of the planar buffer layer is not more than 150 μm.

9. The ceramic substrate as claimed in claim 1, wherein a film is further deposited on the ceramic substrate, and the film is selected from the group consisting of Si, Ge, SiGe, CIGS (Cu—In—Ga—Se system with different molar radio), GaN, GaAs, ZnO, ITO, GZO (Ga doped ZnO) and AZO (Al doped ZnO).

10. The ceramic substrate as claimed in claim 1, wherein the ceramic substrate is applied in solar cells, light emitting diodes, integrated circuit packages, micro electro mechanical systems, electronic devices, or thin film transistors.

* * * * *